(12) United States Patent
Cestero et al.

(10) Patent No.: US 7,674,691 B2
(45) Date of Patent: Mar. 9, 2010

(54) METHOD OF MANUFACTURING AN ELECTRICAL ANTIFUSE

(75) Inventors: Alberto Cestero, Poughkeepsie, NY (US); Byeongju Park, Plainview, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 11/683,068

(22) Filed: Mar. 7, 2007

(65) Prior Publication Data

US 2008/0217736 A1 Sep. 11, 2008

(51) Int. Cl.
*H01L 21/326* (2006.01)
(52) U.S. Cl. .................. 438/467; 438/600; 257/530; 257/E23.147; 257/E21.592
(58) Field of Classification Search ............ 438/467, 438/600, 131; 257/530, 209, E23.147, E21.592
See application file for complete search history.

(56) References Cited

U.S. PATENT DOCUMENTS

| | | | |
|---|---|---|---|
| 4,914,055 A | | 4/1990 | Gordon et al. |
| 5,272,666 A | | 12/1993 | Tsang et al. |
| 5,412,593 A | | 5/1995 | Magel et al. |
| 5,621,691 A | | 4/1997 | Park |
| 5,821,558 A | * | 10/1998 | Han et al. ............ 257/52 |
| 5,854,510 A | * | 12/1998 | Sur et al. ............ 257/529 |
| 5,903,041 A | | 5/1999 | La Fleur et al. |
| 5,976,943 A | * | 11/1999 | Manley et al. ............ 438/382 |
| 6,031,275 A | * | 2/2000 | Kalnitsky et al. ......... 257/530 |
| 6,051,851 A | * | 4/2000 | Ohmi et al. ............ 257/185 |
| 6,096,580 A | | 8/2000 | Iyer et al. |
| 6,258,700 B1 | * | 7/2001 | Bohr et al. ............ 438/467 |
| 6,323,534 B1 | | 11/2001 | Marr et al. |
| 6,346,846 B1 | | 2/2002 | Bertin et al. |
| 6,388,305 B1 | | 5/2002 | Bertin et al. |

(Continued)

FOREIGN PATENT DOCUMENTS

WO WO 2004/100271 A1 11/2004

(Continued)

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

(Continued)

*Primary Examiner*—Steven J Fulk
(74) *Attorney, Agent, or Firm*—Whitham, Curtis, Christofferson & Cook, P.C.

(57) ABSTRACT

An antifuse having a link including a region of unsilicided semiconductor material may be programmed at reduced voltage and current and with reduced generation of heat by electromigration of metal or silicide from a cathode into the region of unsilicided semiconductor material to form an alloy having reduced bulk resistance. The cathode and anode are preferably shaped to control regions from which and to which material is electrically migrated. After programming, additional electromigration of material can return the antifuse to a high resistance state. The process by which the antifuse is fabricated is completely compatible with fabrication of field effect transistors and the antifuse may be advantageously formed on isolation structures.

6 Claims, 13 Drawing Sheets

U.S. PATENT DOCUMENTS

| | | |
|---|---|---|
| 6,396,120 B1 | 5/2002 | Bertin et al. |
| 6,396,121 B1 | 5/2002 | Bertin et al. |
| 6,433,404 B1 | 8/2002 | Iyer et al. |
| 6,498,056 B1 | 12/2002 | Motsiff et al. |
| 6,512,284 B2 | 1/2003 | Schulte et al. |
| 6,570,207 B2 | 5/2003 | Hsu et al. |
| 6,577,156 B2 | 6/2003 | Anand et al. |
| 6,617,914 B1 | 9/2003 | Kothandaraman |
| 6,621,324 B2 | 9/2003 | Fifield et al. |
| 6,624,031 B2 | 9/2003 | Abadeer et al. |
| 6,624,499 B2 | 9/2003 | Kothandaraman et al. |
| 6,661,330 B1 | 12/2003 | Young |
| 6,750,530 B1 | 6/2004 | Klaasen et al. |
| 6,751,137 B2 | 6/2004 | Park et al. |
| 6,753,590 B2 | 6/2004 | Fifield et al. |
| 6,794,726 B2 | 9/2004 | Radens et al. |
| 6,815,797 B1 * | 11/2004 | Dark et al. .................. 257/530 |
| 6,853,049 B2 | 2/2005 | Herner |
| 6,879,021 B1 | 4/2005 | Fitfield et al. |
| 6,882,027 B2 | 4/2005 | Brintzinger et al. |
| 6,927,997 B2 | 8/2005 | Lee et al. |
| 6,944,054 B2 | 9/2005 | Rueckes et al. |
| 6,972,614 B2 | 12/2005 | Anderson, II et al. |
| 7,087,499 B2 | 8/2006 | Rankin et al. |
| 2004/0004268 A1 | 1/2004 | Brown et al. |
| 2005/0110113 A1 * | 5/2005 | Lin et al. ..................... 257/530 |
| 2005/0247997 A1 | 11/2005 | Chung et al. |
| 2006/0102982 A1 * | 5/2006 | Park et al. .................... 257/528 |
| 2006/0278932 A1 | 12/2006 | Kothandaraman et al. |
| 2007/0205485 A1 * | 9/2007 | Hsu et al. ..................... 257/530 |

FOREIGN PATENT DOCUMENTS

WO    WO 2006/028946 A2    3/2006

OTHER PUBLICATIONS

U.S. Appl. No. 11/307,785, entitled, "System and Method for Increasing Reliability of Electrical Fuse Programming", filed Feb. 22, 2006, to Byeongju Park et al.

U.S. Appl. No. 11/462,070, entitled, "Anti-Fuse Structure Optionally Integrated With Guard Ring Structure", filed Aug. 3, 2006, to James W. Adkisson et al.

U.S. Appl. No. 11/366,879, entitled, "Programmable Anti-Fuse Structures, Methods for Fabricating Programmable Anti-Fuse Structures, and Methods of Programming Anti-Fuse Structures", filed Mar. 2, 2006, to Louis C. Hsu.

U.S. Appl. No. 11/161,320, entitled, "Doped Single Crystal Silicon Silicided Efuse", filed Jul. 29, 2005, to William R. Tonti et al.

U.S. Appl. No. 11/266,740, entitled, "Efuse and Methods of Manufacturing the Same", filed Nov. 3, 2005, to William R. Tonti et al.

* cited by examiner

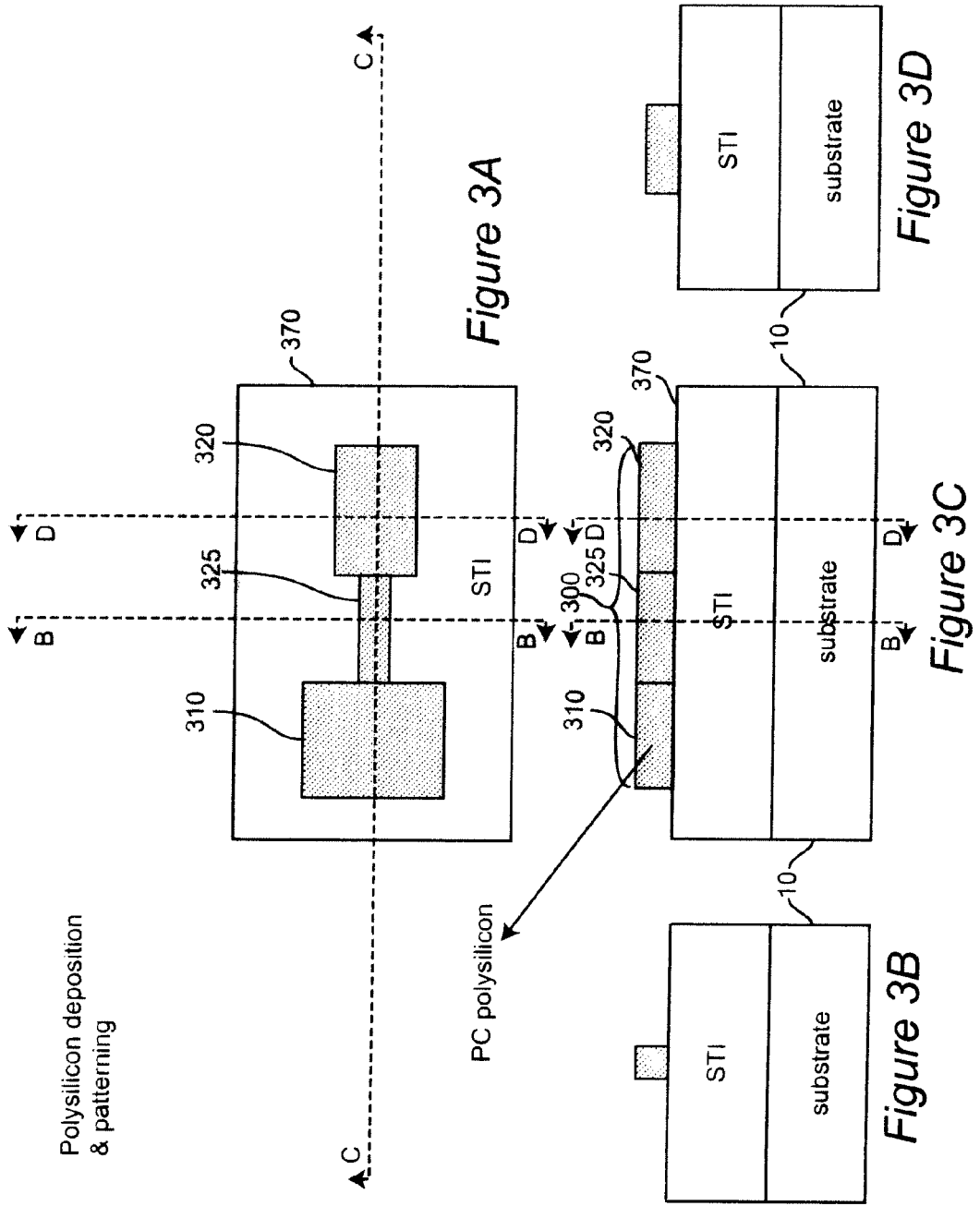

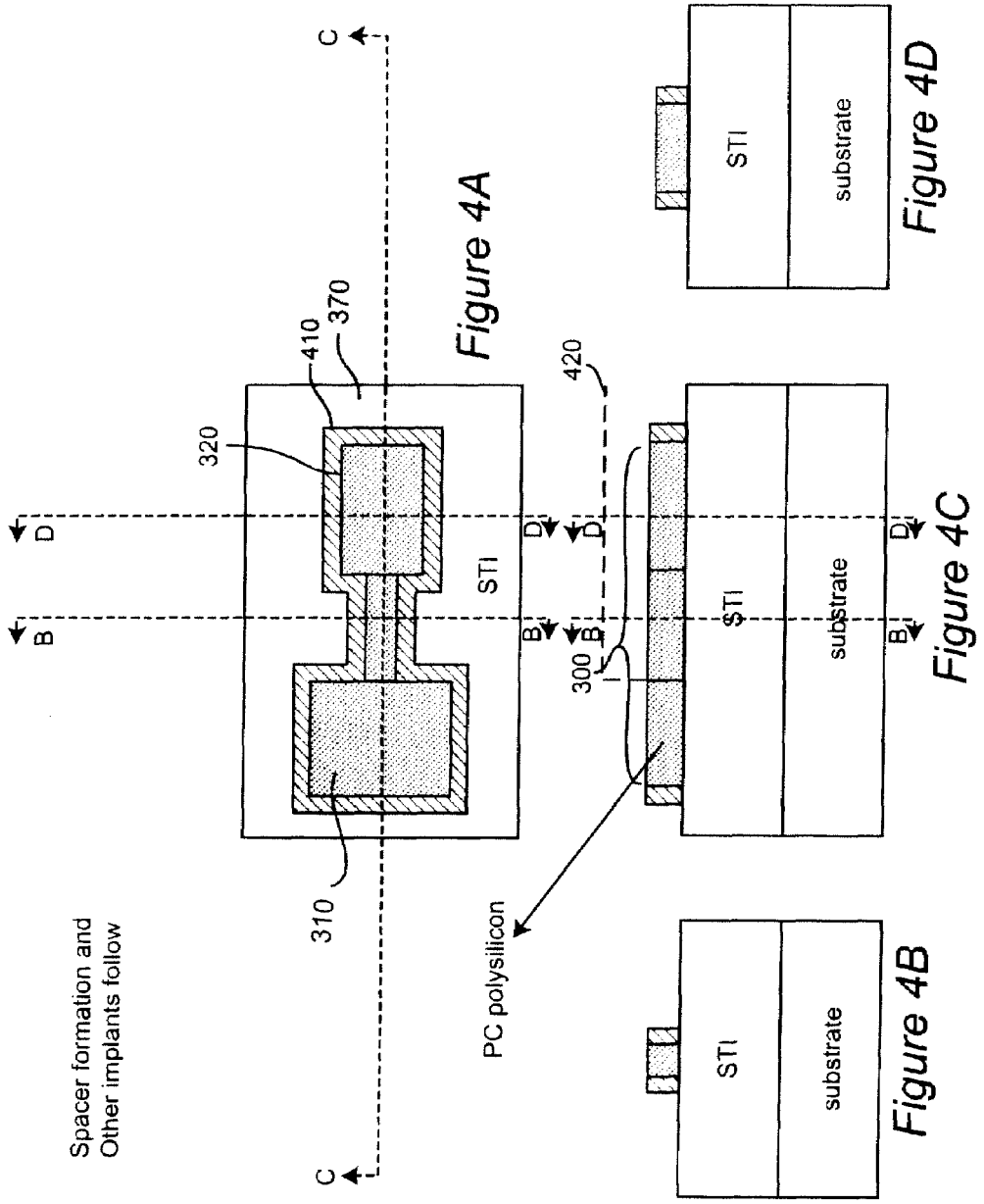

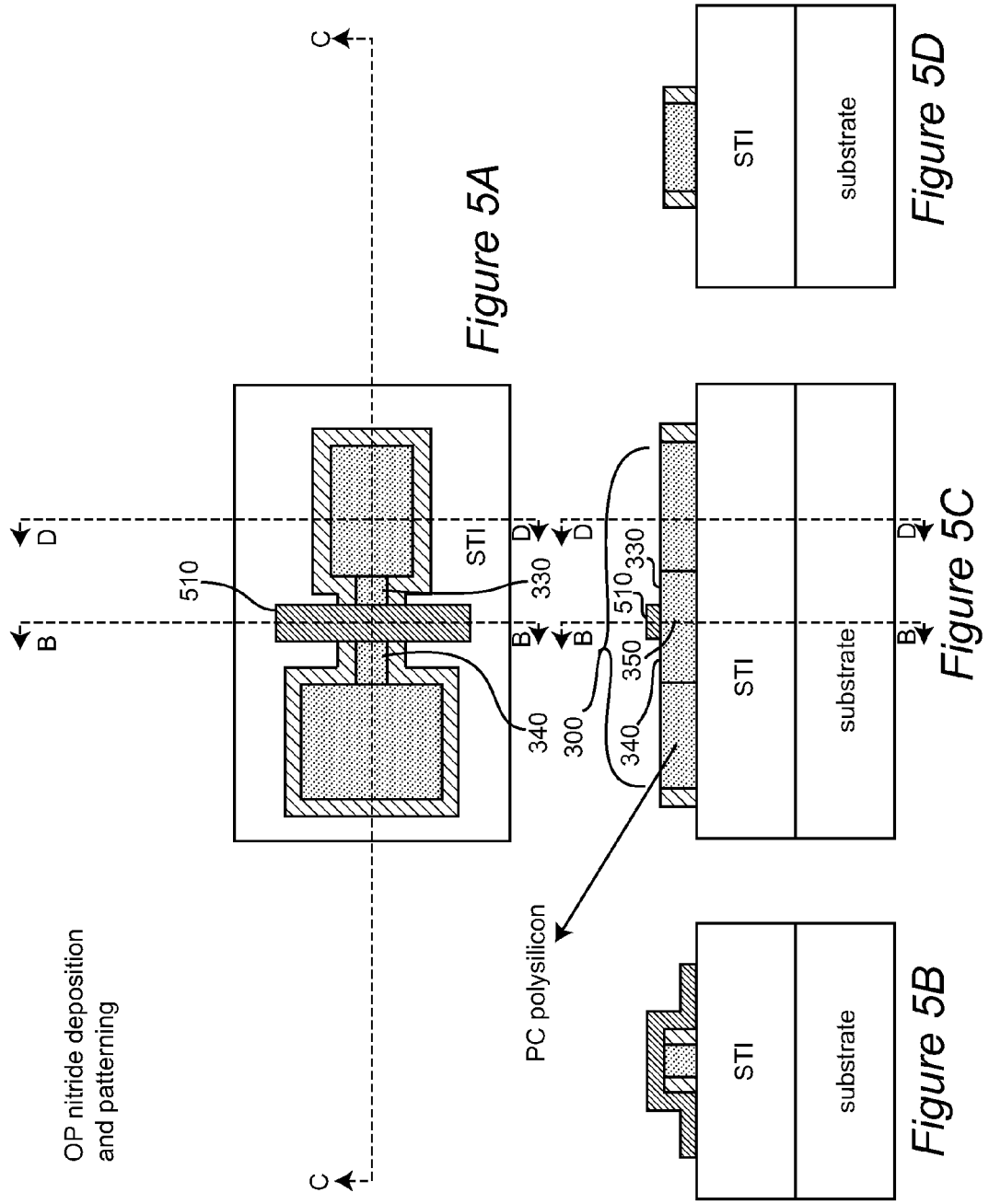

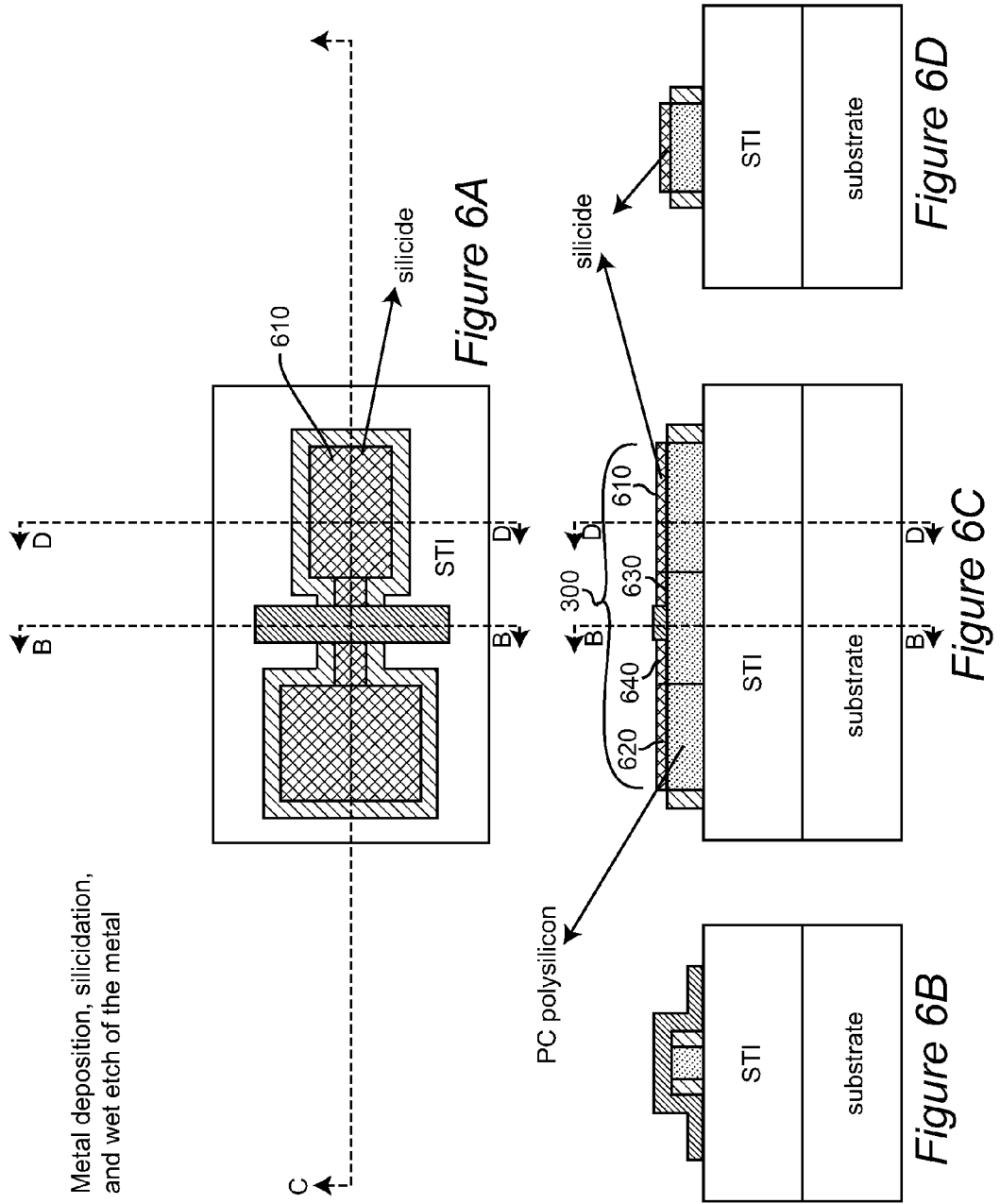

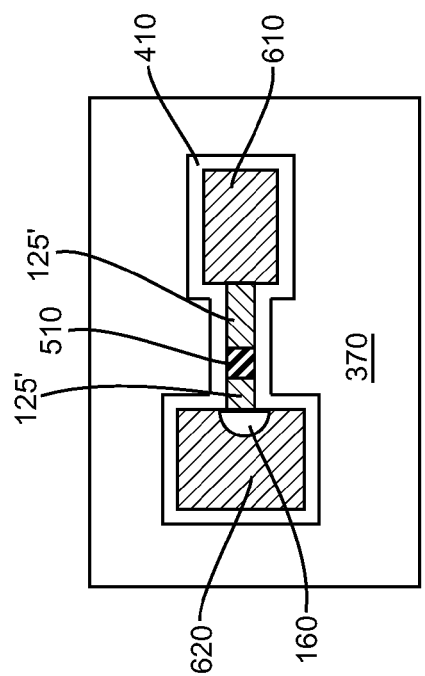
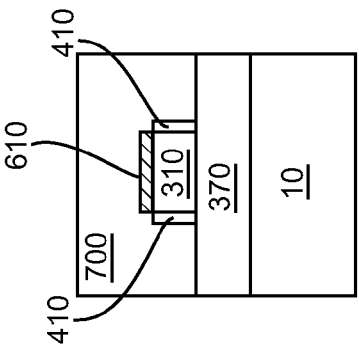
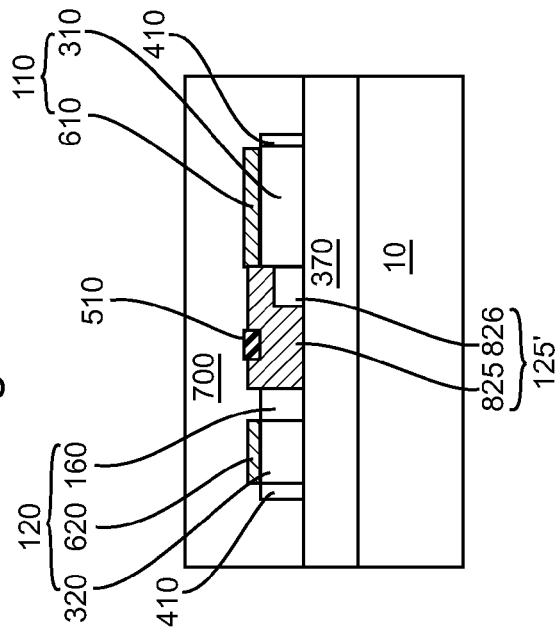

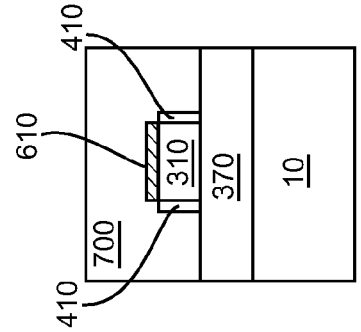
*Figure 10D*
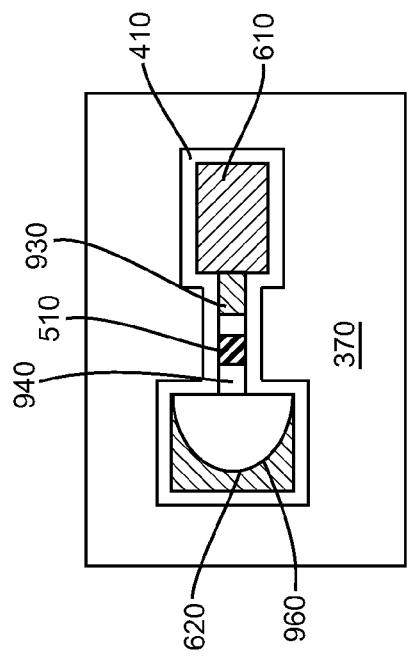
*Figure 10A*
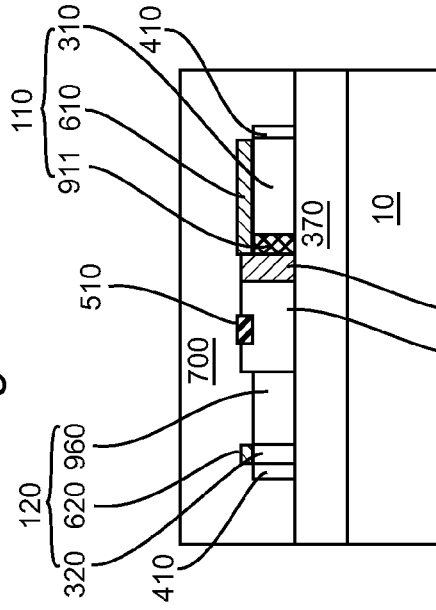
*Figure 10C*
*Figure 10B*

METHOD OF MANUFACTURING AN ELECTRICAL ANTIFUSE

BACKGROUND OF THE INVENTION

1. Field of the Invention

The present invention generally relates to electrical antifuses and, more particularly, to antifuses which are compatible with current CMOS manufacturing processes and which can be programmed easily, rapidly and with high reliability to alter electrical characteristics thereof by a readily detectable margin.

2. Description of the Prior Art

The use of fuses and antifuses in integrated circuits has become widespread in recent years, particularly for substituting spare circuits or circuit elements for defective circuits and circuit elements in order to increase manufacturing yield and avoid economic losses due to costs incurred in fabricating an integrated circuit which may not meet required specifications. Further, fuses and antifuses have been used to tailor circuit parameters for optimal performance and to electronically identify chips such as radio frequency (RF) chip identification. In recent years, fuses, in which resistance is increased during programming, and antifuses, in which resistance is decreased during programming, have also found applications in structures of choice for so-called "write once read many (WORM)" non-volatile memory cells.

This latter application, in particular, has imposed some stringent requirements on the size and structure of fuses and antifuses and on the process of fabricating such structures and the manner in which such fuses and antifuses may be programmed. This is particularly so since such applications often require numerically large arrays of fuses and/or antifuses integrated with circuits which are formed in accordance with other technologies and which may be compromised by aspects of the programming process, particularly if performed with desirable rapidity over part or all of the array. In general, antifuses are considered to be preferable to fuse structures since they can be fabricated at smaller dimensions, thus allowing numerically larger arrays in a given chip area.

However, at the present state of the art, antifuses have numerous serious drawbacks. For example, antifuses have been fabricated as a sandwich of two regions of conductive material separated by an insulating layer which can be broken down by a current developed by a suitably high programming voltage (e.g. typically above 6 volts). However, a severe trade-off exists between the level of the required high programming voltage and the potential for damage to other circuits on the chip and reliable operation of the programmed antifuse at lower voltages (e.g. about 5 volts or less). Good reproducibility of programming results is also difficult to achieve. Further, the dielectric layer presents substantial capacitance which slows circuit operation, particularly where numerous, unprogrammed antifuses exist on a single word or bit line. Further, a low pressure chemical vapor deposition process, which is required to deposit the dielectric with high uniformity in the film composition and thickness, may induce the formation of so-called hillocks in the first metallic layer.

Another antifuse structure comprises an interlayer of amorphous silicon (having a thickness about twenty times greater or more than the dielectric sandwich described above for comparable programming voltages) sandwiched between first and second layers of metal. However, such structures have extremely high leakage currents which can cause serious problems of controllability of programming and, in turn, severe storage time degradation problems. Additionally, such structures may be prone to crack propagation and continuity failure over long periods of use.

SUMMARY OF THE INVENTION

It is therefore an object of the present invention to provide an antifuse structure of simple design which can be fabricated at a small size using processes which are compatible with formation of other devices using other technologies, particularly CMOS technology, and which can be rapidly and reliably programmed with a relatively low voltage and current with low heat generation.

According to the present invention, an antifuse is provided which comprises an anode having an anode semiconductor and an anode silicide, a cathode having a cathode semiconductor and a cathode silicide, a link having a first silicided portion adjoining the anode and containing a first link semiconductor and a first link silicide, a second silicided portion adjoining the cathode and containing a second link semiconductor and a second silicide, and an unsilicided portion containing a third link semiconductor adjoining the first link semiconductor and the second link semiconductor.

Each of the anode semiconductor, the cathode semiconductor, the first link semiconductor, the second semiconductor, and the third semiconductor preferably comprises a material selected from the group consisting of polysilicon, polycrystalline silicon-germanium alloy, polycrystalline silicon-carbon alloy, polycrystalline silicon-germanium-carbon alloy. Further, each of the anode silicide, the cathode silicide, the first silicide, and the second silicide comprises a material selected from the group consisting of a metal silicide, a metal silicide-metal germanide alloy, a metal silicide-metal carbide alloy, or a metal silicide-metal carbide-metal germanide alloy.

Preferably, among other possible arrangements such as forming the antifuse in accordance with the present invention in monocrystalline silicon above a buried oxide (BOX) in silicon-on-insulator (SOI) technology, the antifuse further comprises shallow trench isolation, wherein the shallow trench isolation is located directly beneath the cathode, the anode, and the link. Also preferably, the antifuse comprises a dielectric material mask located directly on the third link semiconductor and not directly on the first link semiconductor or the second link semiconductor.

The unsilicided portion has a length to width ratio in the range from about 1.5:1 to 12:1, and preferably in the range from about 3:1 to 8:1. The antifuse may further comprise a sidewall spacer at a periphery of the anode, the link and the cathode. Preferably, at least the cathode semiconductor is doped with dopants. The anode semiconductor, the first link semiconductor, the second link semiconductor, and the third link semiconductor may or may not be doped.

According to the present invention, a method of programming an antifuse having an anode, a cathode, and a link containing an unsilicided portion is provided. The method comprises the steps of electromigrating a silicide containing material into the unsilicided portion of the link; and reducing the resistance of the antifuse.

Preferably, a weakly depleted silicide region is formed in the cathode during the electromigrating, wherein the weakly depleted silicide region adjoins the link and is devoid of the silicide containing material. The electromigration is preferably performed through a voltage pulse across the anode and the cathode.

According to the present invention, the method may include a further step of electromigrating material from the link toward the anode to form an electromigrated semiconductor portion in the link which does not contain a significant concentration of silicide or a silicide alloy but substantially contains only a semiconductor material. Alternatively, the material may be electromigrated from the link toward the cathode to form an electromigrated semiconductor portion in the link. The resistance of the antifuse increases during such electromigrating of material from the link toward the anode. Preferably, a strongly silicide depleted region is formed from the weakly silicide depleted region, wherein the strongly silicide depleted region has a larger area than the weakly silicide depleted region.

According to the present invention, a method of manufacturing an antifuse comprises the steps of patterning a polycrystalline silicon containing material layer to form a shape containing an anode, a cathode, and a link, wherein the link connects the anode and the cathode, masking a portion of the link with a dielectric material mask and forming a silicide containing material directly on portions of the shape exposed by the mask.

Preferably, the method further comprises the step of forming contacts on the anode and the cathode capable of carrying a sufficient current to cause electromigration of material within the link. Also preferably, dopants are introduced into at least the polycrystalline silicon containing material layer within the cathode by in-situ doping or by ion implantation.

Preferably, the method further comprises the steps of forming a dielectric material layer on the shape; and lithographically patterning the dielectric material layer to form the dielectric material layer. Preferably, the portion of the link has a length and a width, wherein the ratio of the length to width is in the range from about 1.5:1 to about 12:1, and more preferably in the range from about 3:1 to 8:1. The method preferably further comprises forming shallow trench isolation prior to the patterning of the polycrystalline silicon containing material layer, forming a sidewall spacer at a periphery of the anode, the link and the cathode; and forming a middle-of-line dielectric over the anode, the link and the cathode.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A, 3B, 3C and 3D illustrate plan and vertical sectional views of the antifuse in accordance with the invention during an initial stage of fabrication, FIGS. 4A, 4B, 4C, 4D, 5A, 5B, 5C, 5D, 6A, 6B, 6C and 6D, are plan and sectional views showing intermediate stages of fabrication, FIGS. 8A, 8B, 8C and 8D show plan and vertical cross-sectional views similar to those of FIGS. 3-7 for a programmed antifuse in accordance with the present invention, FIG. 10 shows plan and vertical cross-sectional views, similar to those of FIGS. 3-7, for a twice programmed antifuse in accordance with the present invention.

DETAILED DESCRIPTION OF A PREFERRED EMBODIMENT OF THE INVENTION

Figure 1:
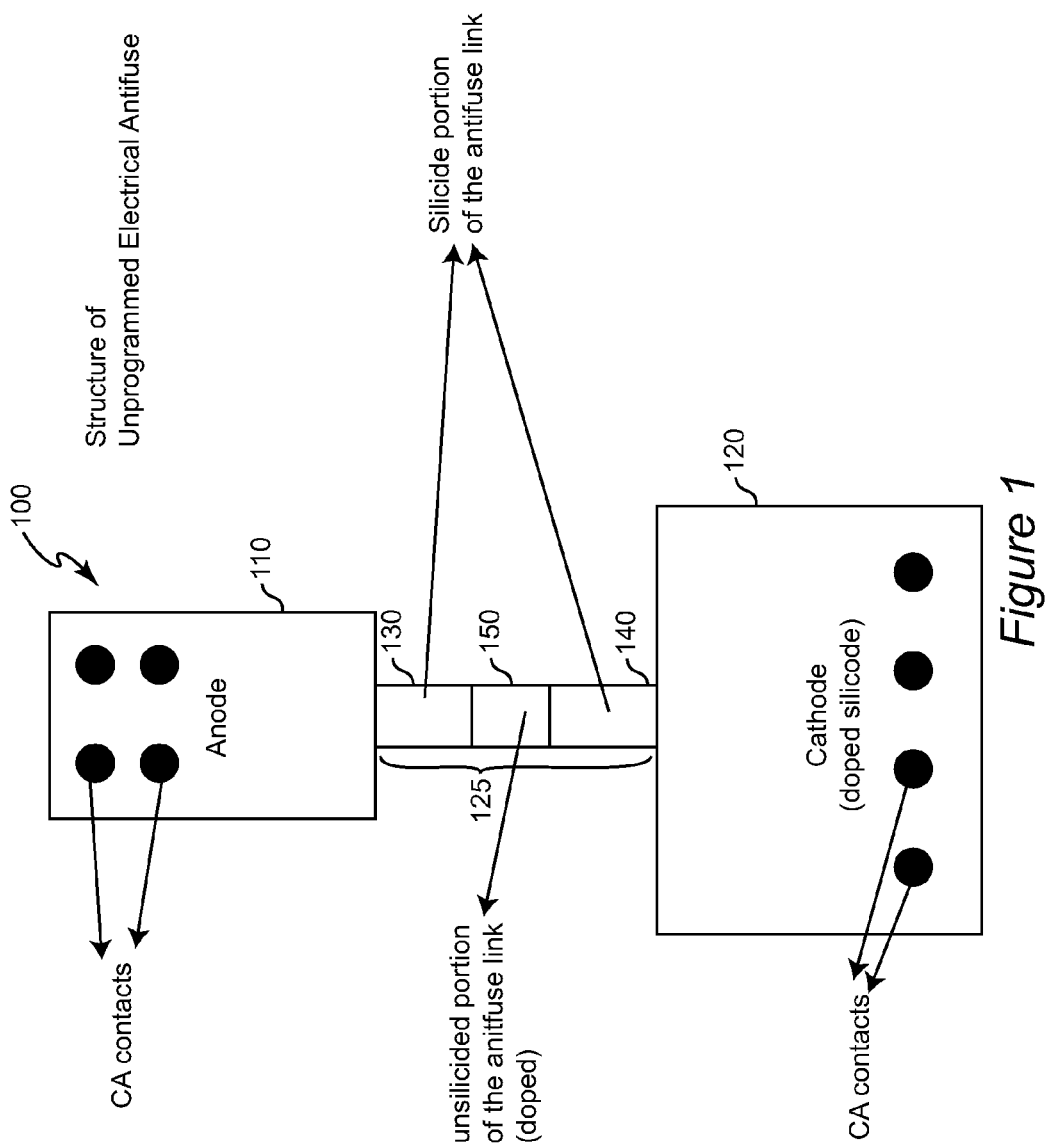
FIG. 1 is a schematic plan view of an antifuse in accordance with the present invention, as fabricated, that is, as unprogrammed.

Referring now to the drawings, and more particularly to FIG. 1, there is shown, in plan view, a schematic representation of an antifuse in accordance with the present invention. Basically, the antifuse 100 in accordance with the present invention includes two enlarged rectangular terminal portions designated as an anode 110 and a cathode 120, each of which preferably comprises a stack of a polycrystalline silicon containing material layer and a silicide containing layer. The present invention can also be implemented in other technologies such as in a monocrystalline layer over a buried oxide (BOX) layer in semiconductor-on-insulator technology or other embodiments which will be apparent to those skilled in the art in view of the following discussion which, for clarity, will be provided in connection with the preferred polysilicon structure but which should be understood as inclusive of and comprehending other technologies and materials.

The preferred polycrystalline silicon containing material layer is located at the bottom, typically and preferably on top of shallow trench isolation, and the silicide containing layer is located directly on the polycrystalline silicon containing material layer. The polycrystalline silicon containing material layer may comprise polysilicon, polycrystalline silicon-germanium alloy, polycrystalline silicon-carbon alloy, polycrystalline silicon-germanium-carbon alloy, or other silicon containing alloy material that is polycrystalline in structure. The silicide containing layer comprises a silicide containing material, which may be a metal silicide, a metal silicide-metal germanide alloy, a metal silicide-metal carbide alloy, or a metal silicide-metal carbide-metal germanide alloy. The metal from which the silicide containing layer derives may be Ta, Ti, W, Co, Ni, Pt, other refractory metal, or an alloy thereof. Each portion of the polycrystalline silicon containing material layer and the silicide containing layer may be doped with dopants such as B, Ga, P, As, and Sb or alternatively undoped. Therefore, the anode 110 and the cathode 120 may or may not have the same doping in the polycrystalline silicon containing material layer or in the silicide containing layer. As will be shown below, it is preferred to have electrical dopants in the polycrystalline silicon containing material layer within the cathode 120 to provide sufficient electrical current even after some silicide electromigrates out of the cathode 120 into the link 125.

Typically, the polycrystalline silicon containing material layer has a thickness from about 60 nm to about 150 nm, and preferably from about 80 nm to about 120 nm. In a heavily doped polycrystalline silicon containing layer, the corresponding sheet resistance, or the resistance of a structure with a square geometry, is about 600 Ohms per square.

The silicon containing layer typically has a thickness from about 10 nm to about 40 nm, and preferably from about 15 nm to about 25 nm. The corresponding sheet resistance is about 10 Ohms per square.

The anode and cathode are so denominated based on the intended direction of current flow during programming as well as in service, even though no diode or other non-linear conduction characteristic is exhibited, as will be discussed in further detail below. Although the shape and size of the anode and cathode are not particularly critical to the successful practice of the invention, it is preferred that the anode be somewhat smaller than the cathode and have a high aspect ratio in the direction of the link while the cathode is somewhat larger and of a lower aspect ratio in the direction of the link than the anode. These features will be at least helpful in maintaining desired resistance levels in the programmed and unprogrammed states of the antifuse 100 as well as assisting in providing increased rapidity and reliability of programming as will be apparent from the following discussion. Each of the anode 110 and cathode 120 is also provided with electrical contacts such as the metal filled via contacts (CA) illustrated, which are preferred, and which are capable of carrying a sufficient current to cause electromigration of material (e.g. metal or silicide) and alloy formation.

The anode 110 and the cathode 120 are connected by a link 125 which is narrower than the anode 110 or cathode 120. According to the present invention, the link 125 preferably comprises three sections: a first silicided portion 130 adjoining the anode, a second silicided portion 140 adjoining the cathode 120, and an unsilicided portion 150 between the first silicided portion 130 and the second silicided portion 140. Again, dimensions are not particularly critical to successful practice of the invention but a nominal width of the link 125 of about 63 nm or minimum resolvable (or design rule) lithographic feature size of the lithography tools, if less, is preferred for application of the inventive antifuse to integrated circuit designs. Each of the length of first and second silicided portions (130, 140) preferably exceeds the overlay error tolerance of the mask utilized to form a silicide blocking nitride layer 510 (FIG. 5A-5D) as will be described below such that the silicide blocking nitride layer 510 does not contact the anode 110 or cathode 120 due to mask misalignment within manufacturing specification (i.e., in-spec overlay errors). The unsilicided portion 150 between portions 130 and 140 is preferably of the same width as the unsilicided portion 150 and of a length in the range from about 1.5 times the width of the unsilicided portion 150 to about 12 times the width of the unsilicided portion 150, and preferably in the range from about 3 times the width of the unsilicided portion 150 to about 8 times the width of the unsilicided portion 150. The unsilicided portion 150 of link 125 is provided to establish a conduction path of relatively high resistance between the anode and cathode which will allow the antifuse in accordance with the present invention to be electrically programmed and reliably read. Contacts are formed on the anode 110 and the cathode 120 so that the contacts are capable of carrying a sufficient current to cause electromigration of material within the link 125, and preferably, also from the cathode 120 to move a silicide containing material into the unsilicided portion 150 of the link 125.

Figure 2:
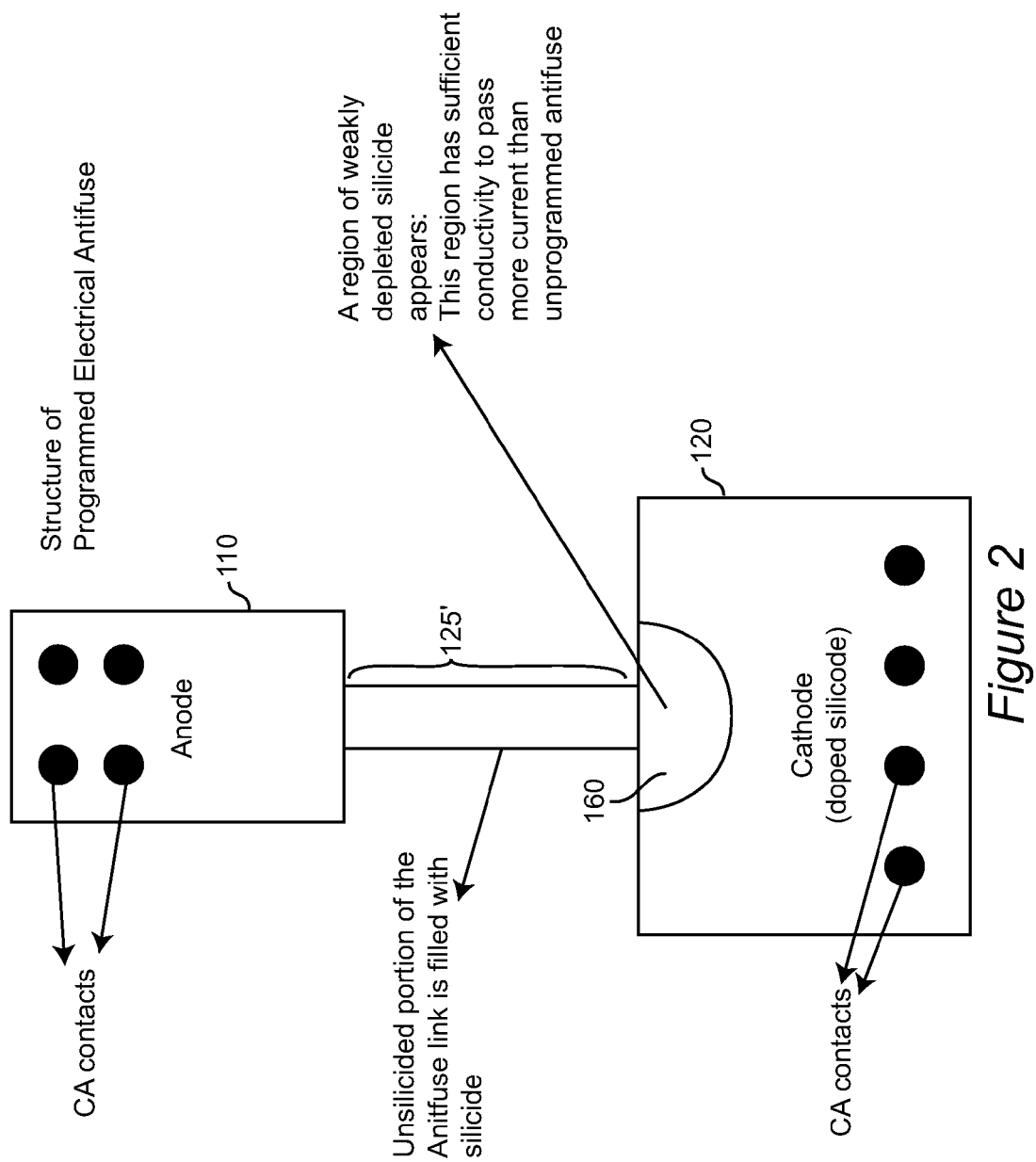
FIG. 2 is a schematic plan view of an antifuse in accordance with the present invention, as programmed.
Figure 7A:
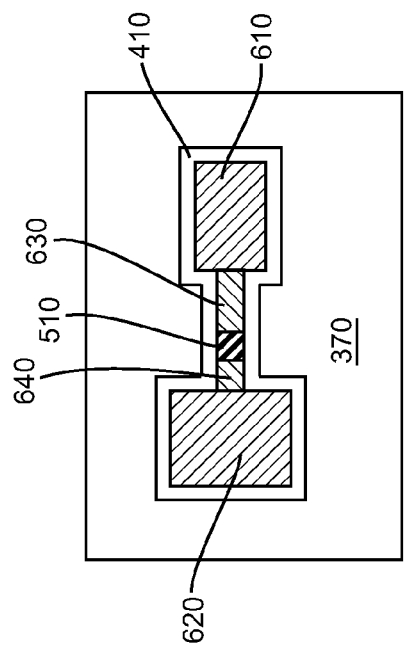
FIGS. 7A, 7B, 7C and 7D illustrate plan and sectional views of the completed antifuse of FIG. 1, (wherein, in FIGS. 3A-7D, in vertical sectional views, structure behind the plane of the respective sections is omitted for clarity)
Figure 7D:
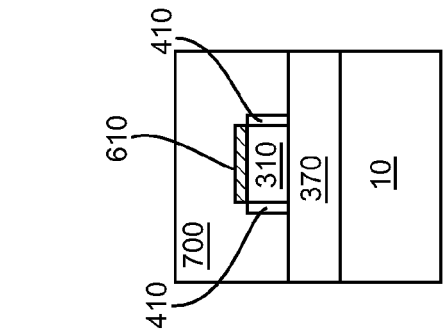
Figure 7C:
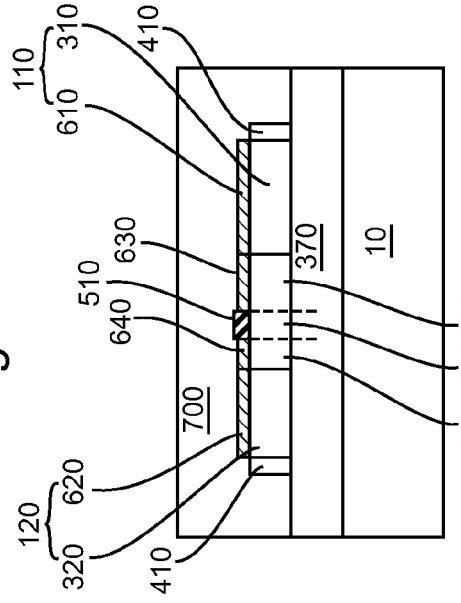
Figure 7B:
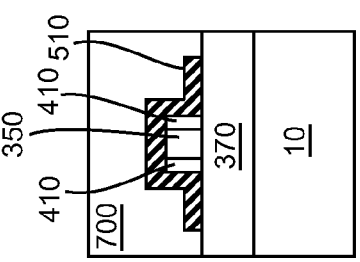

Referring now to FIG. 2, the structure of a programmed antifuse is shown in plan view similar to that of FIG. 1. It will be noted that unsilicided portion 150 of FIG. 1 has been silicided by the programming process and essentially merged with regions 130 and 140 to form a silicide migrated link 125' by migration of the silicide containing layer from the second silicided portion 140 and a region of weakly silicide depleted region 160. The silicide migrated link comprises the same material as the silicide containing layer. Since metal silicide typically has a conductivity about two orders of magnitude higher than the conductivity of a heavily doped semiconductor, the resistance of the silicide migrated link 125' is lower than the resistance of an unprogrammed link 125. Due to the increased conductivity in the silicide migrated link 125' compared with the unprogrammed link 125, a substantial increase in the current flow from anode 110 to cathode 120 results compared with the current through an unprogrammed link 125 under similar bias conditions. While the change in the structure of the anode is ideally as small as possible, typically, a small increase in the resistance of the cathode occurs due to the loss of the silicide containing layer from the cathode from the area of the weakly silicide depleted region 160. Generally, the weakly silicide depleted region 160 is semicircular (or semi-elliptical) with less material of the silicide containing layer per unit area than the remaining area of the cathode 120. The dimensions and semicircular shape of the weakly silicide depleted region 160 are determined by the electromigration mechanism that depends on the temperature and electric field gradient, which are dependent upon the electrical bias, the amount of electrical current, and the geometry of the cathode 120 and the link 125.

The weakly depleted silicided region 160 will thus increase slightly in resistance but should retain sufficient conductivity for the programmed antifuse structure to pass more current than an unprogrammed antifuse under the same bias voltage across the anode 110 and the cathode 120. The doping of the cathode 120, alluded to above, is therefore important in ensuring that sufficient conductivity of region 160 will be maintained even though silicide is weakly depleted therein.

According to the present invention, a conductive link of controllable and generally constant geometry as well as low bulk resistance is achieved by electromigration. This contrasts with prior art methods of narrowing or eliminating the conduction path as is generally the case with electromigration fuses.

The resistance of an unprogrammed antifuse depends largely on the number of squares (a dimensionless number that measures the effect of geometry on sheet resistance, which, for example, may be the ratio of the length to width of a rectangular portion of a film) in the unsilicided portion 150 of an unprogrammed link 125. Typically, each square in the geometry of the unsilicided portion 150 generates about 600 Ohms. If the unsilicided portion 150 has a length to width ratio of 1.5, the resistance of the unsilicided portion is about 900 Ohms. If the unsilicided portion 150 has a length to width ratio of 3, the resistance of the unsilicided portion is about 1,800 Ohms. If the unsilicided portion 150 has a length to width ratio of 8, the resistance of the unsilicided portion is about 4,800 Ohms. If the unsilicided portion 150 has a length to width ratio of 12, the resistance of the unsilicided portion is about 7,200 Ohms Thus, employing exemplary structures with a length to width ratio of about 5~7, an unprogrammed resistance of about 3000-4000 ohms and a reduced programmed resistance of generally less than 1000 Ohms can be achieved although programmed resistance is somewhat variable in accordance with programming parameters as will be discussed in detail below. Such a resistance differential is well within the detection capabilities of known sense amplifier designs currently used although other designs may be more appropriate to antifuses.

Referring now to FIGS. 3A-7D, a method for fabrication of antifuses in accordance with the present invention will now be explained. In FIGS. 3A-7D, views 3A-7A are plan views while views 3B-7B. 3C-7C and 3D-7D are vertical cross-sectional views along the section lines B-B, C-C and D-D, respectively, indicated by dashed lines.

While not critical to the practice of the present invention, it is preferred to form the inventive antifuses on isolation structures such as shallow trench isolation structure 370 in a semiconductor substrate 10. Doing so allows the antifuse to be formed in regions not otherwise usable for other electrical elements on the chip while the isolation structure provides electrical isolation for the fuse when in service and additional protection against breakdown during programming at a voltage higher than otherwise likely to be present on the chip. Moreover, since isolation structures are formed of electrically insulating materials which usually exhibit poor thermal conductivity and isolation structures generally are formed with a substantial thickness, good thermal isolation is also provided by the isolation structure.

The fuse body, or the polycrystalline silicon containing material layer portion of the anode 110, cathode 120, and the link 125 may be formed by any known method such as depositing a layer of polycrystalline silicon containing material, application and lithographic patterning of a photoresist, and the transfer of the pattern into the polycrystalline silicon containing material layer by etching. An anode semiconductor 310 is formed in the anode portion of the antifuse structure. A cathode semiconductor 320 is formed in the cathode portion of the antifuse structure. A link semiconductor 325 is formed in the link portion of the antifuse structure. The anode semiconductor 310, the cathode semiconductor 320, and the link semiconductor 325 are thus contained within and collectively form the shape of the fuse body 300. The material for the exemplary polycrystalline silicon containing material layer is as discussed above. This and other process steps which will be described below can be performed separately or simultaneously with other semiconductor manufacturing processing steps required for formation of transistors or other devices in MOS or other technologies. For example, both the polycrystalline silicon containing layer of the inventive antifuse structure may be formed during the same processing steps as gate electrodes of standard metal-oxide-semiconductor (MOS) devices on the same semiconductor substrate 10.

As shown in FIGS. 4A-4D, spacers 410 are preferably formed, for example, by a conformal deposition of an insulating material layer followed by an anisotropic etch, such as a reactive ion etch (RIE). Preferably, the spacers 410 are formed with the same material and during the same processing steps as gate spacers of standard metal-oxide-semiconductor (MOS) devices on the same semiconductor substrate 10. The spacers 410 provide lateral structural support to the fuse body 300 and, together with the shallow trench isolation 370 and a middle-of-line dielectric 700 (Refer to FIG. 7), defines the volume of the antifuse structure within which materials may electromigrate.

Optionally, impurities may be differentially supplied to the cathode 120 (310) by ion implantation while masking the link 125 (325) and anode 110 (320) with a block mask 420. (Alternatively, if dopant is desired in both the link 125 and anode 110, a desired amount of dopants may be supplied into the fuse body 300 by in-situ doping.) Either an n-type or p-type dopant may be used since its function is merely to increase conductivity of the polycrystalline silicon containing material layer within the cathode 120 such that the resistance of a programmed antifuse will not unduly increase when a portion of the silicide containing layer is depleted from the weakly silicide depleted region 160 during programming. The ion implantation can be performed, for example, during the same processing steps as the implantation for the formation of source and drain regions of standard metal-oxide-semiconductor (MOS) devices on the same semiconductor substrate 10 Then, as shown in FIGS. 5A-5D, a dielectric material mask 510 is formed by depositing and patterning a dielectric material layer such as nitride which can be etched selectively to other exposed materials. The link semiconductor 325 is further divided into three parts by the location of the dielectric material mask 510. A first link semiconductor 330 is the portion of the link semiconductor 325 located between the dielectric material mask 510 and the anode semiconductor 310. A second link semiconductor 340 is the portion of the link semiconductor 325 located between the dielectric material mask 510 and the cathode semiconductor 320. A third link semiconductor 350 is the portion of the link semiconductor 325 located directly beneath the dielectric material mask 510 between the first link semiconductor 330 and the second link semiconductor 340. The link semiconductor 325 thus comprises the first link semiconductor 330, the second link semiconductor 340, and the third link semiconductor 350.

The dielectric material mask 510 is preferably in the form of a stripe which defines the third link semiconductor 350 to protect against silicidation during a silicidation process. The silicidation process is typically performed by blanket deposition of a metal layer on the top surface of the semiconductor structure, followed by a silicidation anneal during which exposed portions (e.g. exposed to the metal deposition) of semiconductor material reacts with the metal layer and forms a silicide. Multiple anneals with different processing temperatures and different processing times may be employed to optimize the silicide. Semiconductor material covered with the dielectric material mask 510 such as the third link semiconductor 350 does not react with the metal layer during the silicidation process, and consequently, no silicide is formed under the dielectric material mask 510. Unreacted metal layer is subsequently removed, for example, by wet etching.

The resulting exemplary structure is shown in FIGS. 6A-6D. A silicide containing layer is formed on top of each of the anode 110, cathode 120, and the first silicided portion 130 and the second silicided portion 140 of the link 125. Specifically, an anode silicide 610 is formed directly on the anode semiconductor 310, a cathode silicide 620 is formed directly on the cathode semiconductor 320, a first silicide 630 is formed directly on the first link semiconductor 330, and a second silicide 640 is formed directly on the second link semiconductor 340. It is noted that the terms "anode silicide", "cathode silicide", "first silicide", and "second silicide" refers to silicide containing layers, which may comprise other materials such as metal germanide or metal carbide. As discussed above, therefore, each of the anode silicide 610, the cathode silicide 620, the first silicide 630, and the second silicide 640 is a metal silicide containing alloy, and thus may comprise a metal silicide, metal silicide-metal germanide alloy, metal silicide-metal carbide alloy, or metal silicide-metal germanide-metal carbide alloy. Preferably, the silicidation formation is performed at the same conditions and during the same processing steps as the silicide formation for source and drain silicides and gate silicides of standard metal-oxide-semiconductor (MOS) devices on the same semiconductor substrate 10.

Then, as shown in FIGS. 7A-7D, a middle-of-line dielectric layer 700 is deposited on top of the antifuse structure and subsequently planarized. The process of depositing the middle-of-line dielectric layer 700 is also generally common for other structures of standard metal-oxide-semiconductor (MOS) devices that are preferably formed on the same semiconductor substrate 10. FIGS. 7A-7D show a completed (except for contact structures depicted in FIG. 1) unprogrammed antifuse structure according to the present invention. The first link semiconductor 330 and the first silicide 630 collectively comprise the first silicided portion 130 in FIG. 1. The second link semiconductor 340 and the second silicide 640 collectively comprise the second silicided portion 140 in FIG. 1. The third link semiconductor 350 comprises the unsilicided portion 150 in FIG. 1.

FIGS. 8A-8D show views for programmed antifuse structure in accordance with the present invention corresponding to those of FIGS. 3A-7D. The weakly silicide depleted region 160 and a silicided migrated link 125' are shown. The silicided migrated link 125' may consist of a migrated silicide link portion 825 only, or as shown in FIGS. 8A-8D, may comprise a migrated silicide link portion 825 and an unsilicided link portion 826. In other words, the unsilicided link portion 826 may or may not exist in the silicided migrated link 125' depending on the nature of electromigration inside the silicided migrated link 125'.

Also, it should be noted that a substantial thickness of doped semiconductor material (with depleted silicide) remains in the weakly depleted silicided region 160 which adjoins the silicided migrated link 125'. The migrated silicide may or may not reach the anode semiconductor 310. The first link semiconductor 330, the second link semiconductor 340, and the third link semiconductor 350 are, at this point, merged into the silicided migrated link 125'.

In view of the foregoing, it is seen that a very simple and easily fabricated antifuse has been provided in accordance with the present invention. Programming of the antifuse can be reliably accomplished with much reduced production of heat compared with other fuse and antifuse programming techniques as will be discussed below.

As indicated above, the antifuse in accordance with the present invention is programmed by causing electromigration of the silicide containing layer within the link 125 and from the cathode 120 through use of a strong programming current to reduce resistance of the unsilicided portion 150 of the link. Therefore, the resistance of the link 125 prior to programming must be relatively low, which in practice may be in the range from about 1,000 Ohms to about 8,000 Ohms, in order to allow a sufficiently strong current to be developed using a voltage that can be withstood, without damage, by other structures formed on the same semiconductor substrate 10.

The resistance of the antifuse link 125 is also subject to some variation during manufacturing. The sensitivity of the resistance detecting arrangements which may be used may also vary widely and present a relatively wide variation in cost which varies inversely with sensitivity. Accordingly, it can be appreciated that the range of resistance which must be exhibited by an antifuse in order to be considered properly programmed and to be reliably detected as such is necessarily limited to a greater or lesser degree in accordance with a number of factors, conditions and parameters which should be considered and observed for particular environments and applications of the antifuse in accordance with the present invention as will be discussed below. Combinations of such factors, conditions and parameters which yield reliable and reliably detectable programming are referred to as a programming window.

Figure 9:
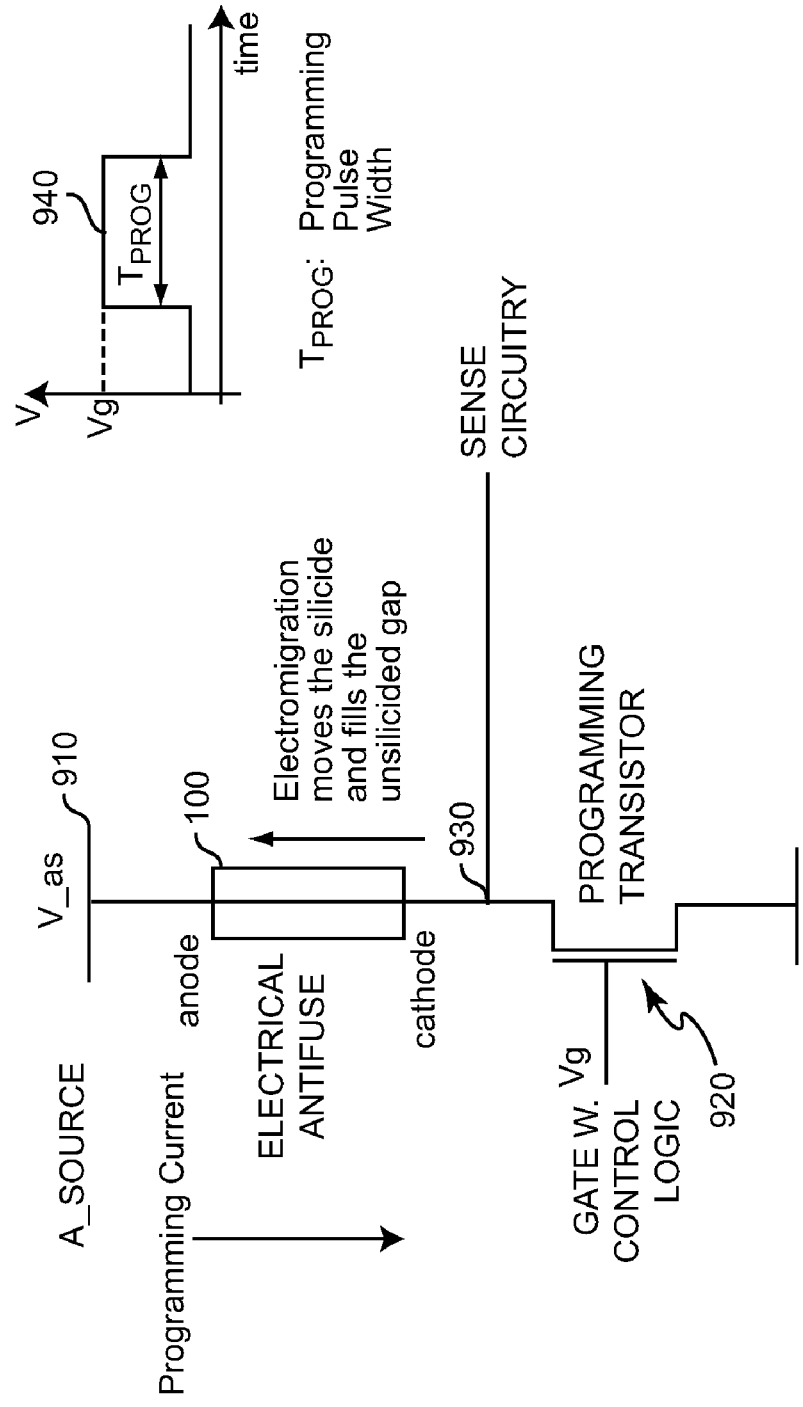
FIG. 9 is a schematic diagram of a suitable circuit for programming the antifuse in accordance with the present invention.

FIG. 9 is a schematic diagram of a simple exemplary circuit which can be used for programming an antifuse in accordance with the present invention as well as sensing the programmed or unprogrammed state of antifuses. A source 910 of programming voltage Vas (sometimes referred to as Vfs) is provided to which antifuse 100 is connected. A transistor 920 is also connected in series with the antifuse 100 which forms a connection to ground. Suitable control logic, the details of which are substantially unimportant to the invention is connected to the gate or control electrode(s) of transistor 920. Sensing circuitry, the details of which are also largely unimportant to the successful practice of the invention, is connected to the node 930 between the antifuse 100 and transistor 920.

However, it is important to recognize and appreciate that transistor 920 will exhibit some finite "on" resistance which will depend on its design and the control voltage Vg applied thereto; both of which are parameters by which the programming window is, in part, defined. Further, while the particulars of the implementation of sense circuitry are not important to the successful practice of the invention, the sensitivity thereof is also a parameter by which the programming window is defined.

In order to program an antifuse in accordance with the present invention and for production of the data which will be discussed below, a circuit such as that shown in FIG. 9 is applied to an antifuse 100. For the sake of programming the antifuse 100, the voltage Vas is set at a constant value, of which the range is from about 1.0V to about 10.0V, preferably from about 2.0V to about 5.0V, and more preferably from about 3.0V to 4.0V. A voltage Vg is applied to the control electrode of transistor 920 for the programming pulse time, TPROG, causing a high current through antifuse 100. This current is initially a function of the conductivity of both transistor 920 and the unprogrammed conductivity of the antifuse, as manufactured. As the current to the antifuse increases to a given level where onset of electromigration of the material in the silicide containing layer is observed, electromigration will cause the conductivity of the antifuse to increase due to the reduction of the length of the unsilicided portion 150 of the material in the silicide containing layer migrates from the second silicided portion 140 toward the first silicided portion 130 and the anode 110. When the material in the silicide containing layer has migrated through the length of unsilicided portion 150, the silicide migrated link 125' is formed, which comprises the material in the silicide containing layer but does not then contain an unsilicided polycrystalline silicon containing material.

The ratio of the initial, unprogrammed resistance to the silicided or programmed antifuse resistance is used when designing the sense circuitry and can be used to establish a programming window of Vas and Vg required for different sensing schemes, although the actual sense circuitry is outside the scope of this invention. In normal operation of the circuit of FIG. 9 when programming is not being performed, transistor 920 is turned on and a small reference voltage (e.g. a voltage with magnitude less than 1.0V, and more preferably less than 0.5V) is applied to the programming voltage source connection, Vas, allowing resistance of the programmed or unprogrammed resistance of the antifuse to be directly sensed. Alternatively, and as used to produce the data below, a low value of Vas (e.g. 0.1V-0.5V) and nominal Vg may be applied as during programming and the current through an antifuse and the programming transistor is measured to determine the resistance of the antifuse plus programming transistor in the ON state. This resistance is compared with a preset value to determine if the antifuse is programmed or not. Lower Vas voltages offer the advantage of insuring that no antifuse programming (or additional programming or overprogramming which may raise the resistance of the link, once programmed) occurs accidentally during this resistance measurement since only currents below that which will cause onset of electromigration will be developed at such lower voltages. Initial and programmed antifuse resistance measurements were performed as described for different values of Vas and Vg used during programming.

Referring to FIG. 10, it should be noted in this regard that the possibility of over-programming could be exploited to achieve a "write twice" functionality for the antifuse in accordance with the present invention. That is, at any time subsequent to the initial programming of the antifuse through which a low resistance state of the antifuse is obtained with accompanying structural changes in the link 125 such that silicide migrated link 125' is formed, additional electromigration from the silicide migrated link 125' toward the anode 110 or cathode 120 may be caused by applying a high bias voltage across the anode 110 and the cathode 120.

FIG. 10 shows the structure after the antifuse has been programmed twice such that the second electromigration occurs from the silicide migrated link 125' toward the anode 110. The structure after the second programming comprise a strongly electromigrated link 925' which comprises an electromigrated semiconductor portion 925, which does not contain a significant concentration of silicide or a silicide alloy but contains substantially only a semiconductor material such as polysilicon, silicon-germanium alloy, silicon-carbon alloy, or silicon-carbon-germanium alloy, and a silicide alloy link portion 926 which comprises a material from the silicide containing layer, i.e., contains a silicide alloy.

Since more material is electromigrated from the cathode silicide 620, the size of the cathode silicide 620 shrinks further compared to the size of the cathode silicide after the first programming but prior to the second programming. This enlarges the weakly silicide depleted region 160 to form a strongly silicide depleted region 960, which is larger than the weakly silicide depleted region 160 and oftentimes contains less dopants in the semiconductor material within. The cathode now comprises the cathode semiconductor 320, the cathode silicide 620, and the strongly silicide depleted region 96.

The additional electromigration also moves the material from silicide containing layer, i.e., the cathode silicide 620, the first silicide 630, and the second silicide 640, toward the anode 110, and some of the material may actually move into the anode. The portion of the anode with electromigrated material, or the silicide alloy anode portion 911, is formed adjoining the strongly electromigrated link 925'. After the second programming, the electromigrated material is located either in the silicide alloy link portion 926 or in the silicide alloy anode portion 911.

The additional electromigration from the silicided migrated link 125' toward the cathode 120, or more preferably, toward the anode 110 to form a strongly electromigrated link 925' causes a detectably higher resistance in the twice programmed antifuse structure. According to the present invention, the resistance of the antifuse decreases from an initial unprogrammed resistance value of about 1,000 Ohms to 8,000 Ohms to a programmed antifuse resistance value of less than about ½ of the initial unprogrammed resistance value upon first programming that forms a silicided migrated link 125'. Further, according to the present invention, the resistance of the programmed antifuse resistance increases typically to a strongly-programmed antifuse resistance value of about 10,000 Ohms or above upon second programming of the programmed antifuse that forms a strongly electromigrated link 925'. The structure after the second programming does not restore the unsilicided portion 150 because entropy of the structure increases upon each round of programming but a second programming, which causes the formation of the strongly electromigrated link 925', creates a much wider unsilicided region, or the electromigrated semiconductor portion 925 within the link 125. In other words, once programmed, it is possible for the antifuse in accordance with the present invention to be programmed one additional time in the manner of programming a normal electrical fuse.

Figure 11:
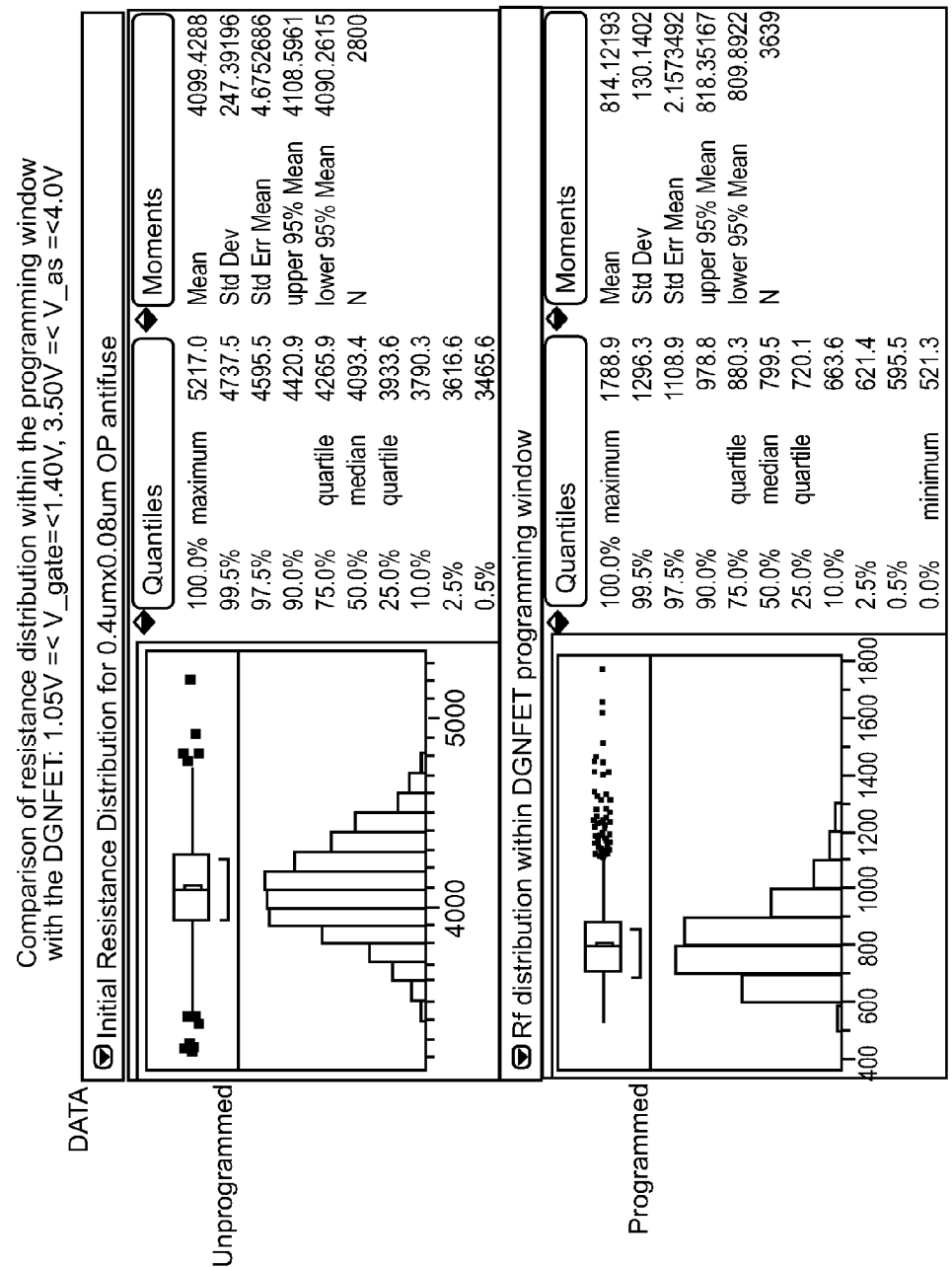
FIGS. 11 and 12 are histograms of resistance distribution before and after programming a first exemplary antifuse structure in accordance with the present invention under two different exemplary sets of programming parameters and different exemplary programming transistor structures, and FIG. 13 provides contour diagrams for the negative logarithm of sense fail probability for sense amplifiers of differing sensitivity to determine the state of a programmed antifuse in accordance with the present invention (e.g. a programming window).
Figure 12:
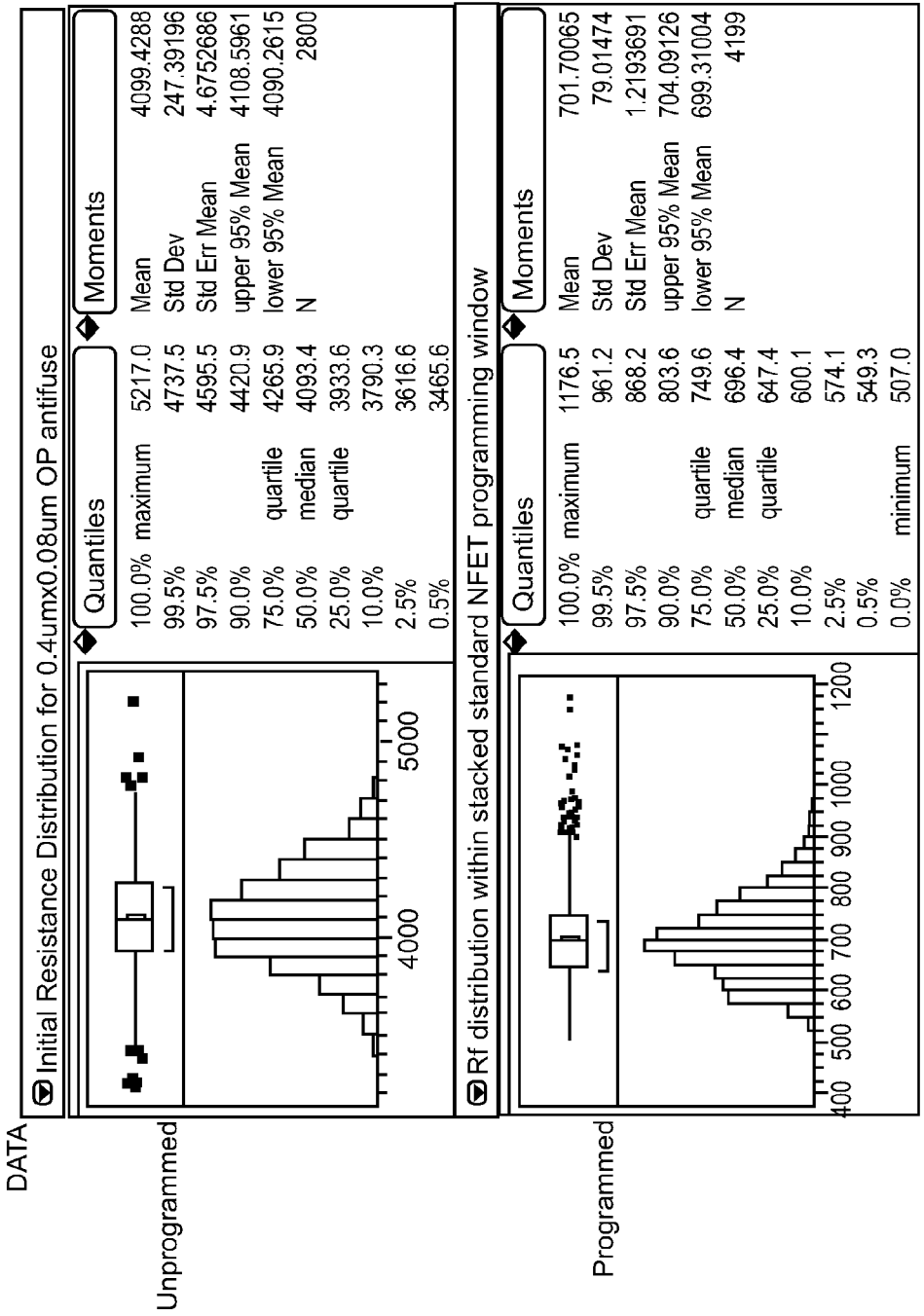

Referring now to FIGS. 11 and 12, statistical data derived from unprogrammed and programmed resistance values of an antifuse in accordance with the present invention are shown in the form of a histogram. The data in both Figures utilized an antifuse with the width of the unsilicided portion 150 of the link 125 at 63 nm and the length of the unsilicided portion 150 of the link at 400 nm, with a resulting number of squares in the unsilicided portion equal to 6.35. The data presented in FIG. 11 was obtained using a single dual gate oxide NFET (DGN-FET) which supports higher voltage required for programming than possible with standard MOS transistors. FIG. 11 shows the antifuse programming results for programming conditions of Vg between 1.05 and 1.40 V, and Vas between 3.50 and 4.0 V. The unprogrammed resistance distribution is substantially Gaussian with a median resistance of 4093 Ohms and a standard deviation of 247.39 Ohms. After programming, the distribution of antifuse resistance values has a median of 799.5 Ohms and a standard deviation of 130.14 Ohms.

The data depicted in FIG. 12 was developed using a stacked standard FET to support higher Vas. The programming conditions of Vg between 1.00 V and 1.40 V, and Vas between 3.40 V and 4.0 V were used to generate the data in FIG. 12. Utilizing a different programming transistor, the programmed resistance distribution produced a median programmed antifuse resistance of 696.4 Ohms and a standard deviation of about 79.0 Ohms. Lower median resistance and a smaller standard deviation in the post-programming antifuse resistance increase the sense margin of a sense circuit, i.e., correct sensing of a programmed antifuse as a programmed antifuse has a higher probability of success.

Figure 13:
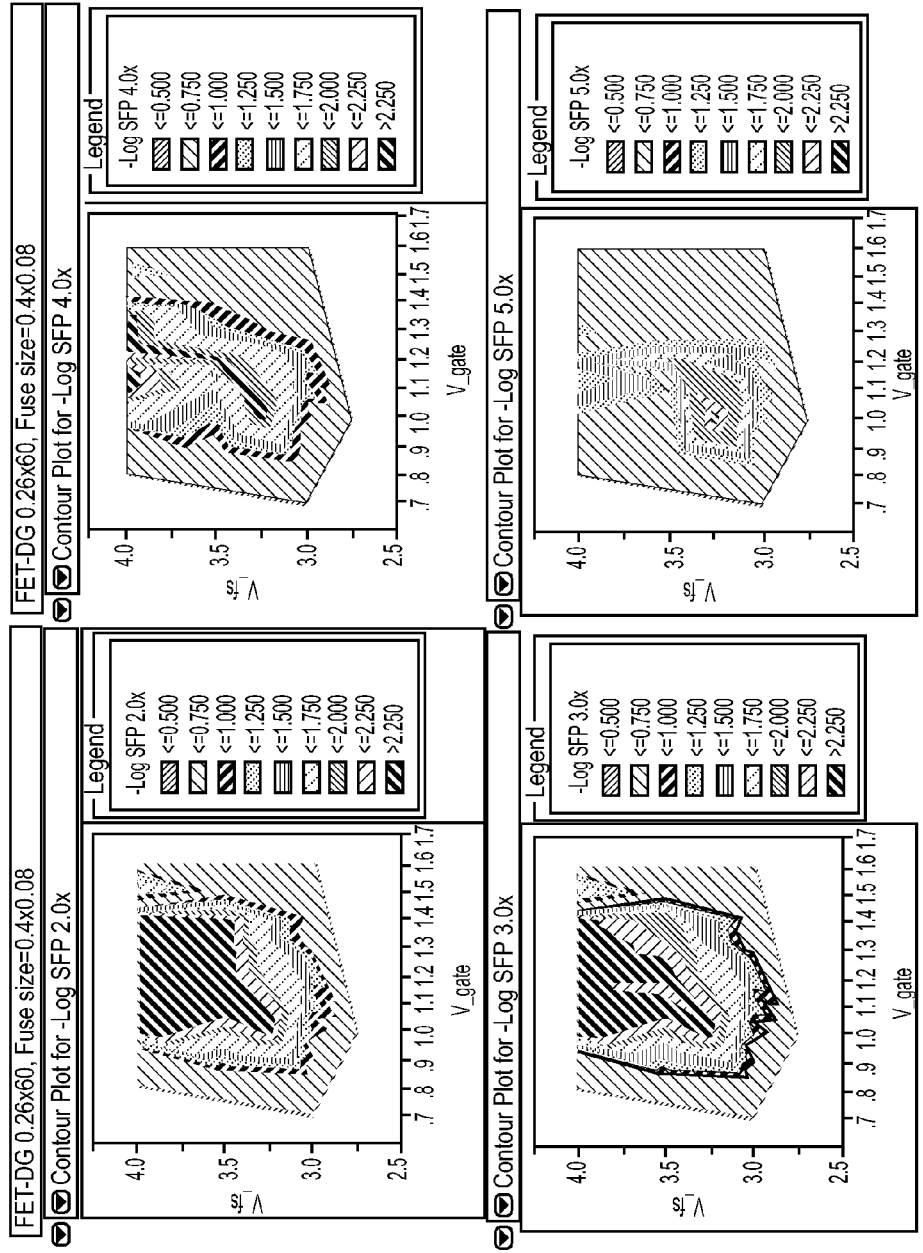

FIG. 13 provides contour diagrams showing the dependence of probability of correct sensing of a programmed antifuse on the programming conditions. The four plots represent four hypothetical sense amplifiers of differing sensitivity to determine the state of a programmed antifuse in accordance with the present invention. The parameter called "negative logarithm of sense fail probability" is defined as the number obtained by multiplying −1 to the logarithm (with base 10) of a sense fail probability at a given programming condition, i.e., at a given V_gate and V_fs conditions. V_gate in the graphs corresponds to the Vg described above and V_fs in the graphs corresponds to the Vas described above. The sense fail probability was calculated for each hypothetical sense amplifiers by dividing the number of antifuses that produced post-programming resistance values greater than ½, ⅓, ¼, and ⅕ of the median initial antifuse resistance values under a given programming condition by the number of total antifuses that were programmed under the given programming conditions. For example, if only four antifuse out of 100 antifuses produced a resistance that exceeds ⅓ of the median initial antifuse resistance values, the sense fail probability for the hypothetical sense amplifier labeled 3× is 4/100 or 0.04. The negative logarithm of sense fail probability in this case is −log(0.04)=~1.397 If no antifuse produced post-programming resistance that exceeds the pre-set comparison value, an arbitrary fail count of 1 was assigned to generate a conservative estimate of the sense fail probability. For example, if no antifuse out of 200 had a post-programming resistance exceeding ½ of the median initial antifuse resistance, the assigned sense fail probability is 1/200 or 0.005.

Contour plots in FIG. 13 show the values of Vg and Vas that would produce correct detection of the programmed or unprogrammed state of the antifuse using sensing arrangements of different sensitivity which are designated in accordance with the resistance ratio which can be reliably distinguished (e.g. a "2.0×" detector is the most sensitive and can reliably detect a resistance ratio of 2:1). The most sensitive detector allows a relatively wide and largely independent variation of Vg and Vas while for a much less sensitive detector (e.g. 5.0×) only a small range of Vg and Vas is reliably usable as a programming window. The wide programming window available using a detector of 4.0× sensitivity clearly indicates the general reliability of programming provided by the invention and the wide latitude of conditions and parameters under which programming of the antifuse according to the invention may be carried out even using a relatively inexpensive detector of relatively low sensitivity. Further, the existence of a usable programming window, even if relatively narrow, indicates that the invention permits a wide latitude of designs and cost of sensing circuitry to be employed without compromise of reliability as long as the programming window corresponding to detector sensitivity is observed.

In view of the foregoing, it is seen that the invention provides a simple, reliably formed and reliably programmable antifuse structure method of fabrication and method of programming which is completely compatible with fabrication processes for MOS transistors as well as other widely used technologies and which can be programmed with sufficient ease and reliability to allow some economies and wide design flexibility to be achieved in sense circuitry.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of manufacturing an antifuse comprising the steps of:
   patterning a polycrystalline silicon containing material layer to form a continuous shape including an anode, a cathode, and a link, wherein said link connects said anode and said cathode in a continuous conduction path which does not exhibit a non-linear conductive characteristic;
   masking a portion of said link with a dielectric material mask; and
   forming a silicide containing material directly on portions of said shape exposed by said mask to form a region of said link without silicide and wherein said link is divided into three portions:
   a first silicided portion adjoining said anode,
   a second silicided portion adjoining said cathode, and
   an unsilicided portion between said first silicided portion and said second silicided portion.

2. The method of claim 1, further comprising the step of forming contacts on said anode and said cathode capable of carrying a sufficient current to cause electromigration of material within said link.

3. The method of claim 1, further comprising the step of introducing dopants into at least said polycrystalline silicon containing material layer within said cathode.

4. The method of claim 1, further comprising the steps of:
   forming a dielectric material layer on said shape; and
   lithographically patterning said dielectric material layer to form said dielectric material layer.

5. The method of claim 4, wherein said portion of said link has a length and a width, wherein the ratio of the length to width is in the range from about 1.5:1 to about 12:1.

6. The method of claim 5, further comprising:
   forming shallow trench isolation prior to said patterning of said polycrystalline silicon containing material layer;
   forming a sidewall spacer at a periphery of said anode, said link and said cathode; and
   forming a middle-of-line dielectric over said anode, said link and said cathode.

* * * * *